(12) United States Patent
Ohsumi et al.

(10) Patent No.: US 7,726,016 B2
(45) Date of Patent: Jun. 1, 2010

(54) MANUFACTURING METHOD OF PRINTED CIRCUIT BOARD

(75) Inventors: Kohichi Ohsumi, Shiga-ken (JP); Kenji Terada, Shiga-ken (JP); Kohichi Yamazaki, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 639 days.

(21) Appl. No.: 10/709,752

(22) Filed: May 26, 2004

(65) Prior Publication Data

US 2004/0222015 A1 Nov. 11, 2004

(30) Foreign Application Priority Data

May 7, 2003 (JP) ............................ 2003-129034

(51) Int. Cl.
*H01K 3/10* (2006.01)
(52) U.S. Cl. ..................... 29/852; 29/846; 174/255; 174/256; 174/262
(58) Field of Classification Search ............. 29/846, 29/852; 174/255, 256, 259, 260, 261, 262, 174/266, 258
See application file for complete search history.

(56) References Cited

U.S. PATENT DOCUMENTS

| | | | |
|---|---|---|---|
| 4,104,111 A | | 8/1978 | Mack |
| 4,902,610 A | * | 2/1990 | Shipley ...................... 430/312 |
| 5,160,579 A | * | 11/1992 | Larson ......................... 216/18 |
| 5,666,722 A | * | 9/1997 | Tamm et al. .................. 29/847 |
| 6,323,439 B1 | | 11/2001 | Kambe et al. |
| 6,531,661 B2 | * | 3/2003 | Uchikawa et al. ............ 174/255 |
| 6,591,495 B2 | * | 7/2003 | Hirose et al. .................. 29/846 |
| 6,717,070 B2 | | 4/2004 | Watanabe |
| 6,828,510 B1 | * | 12/2004 | Asai et al. .................... 174/255 |

FOREIGN PATENT DOCUMENTS

| | | |
|---|---|---|
| JP | 50-41056 | 4/1975 |
| JP | 63280496 | 11/1988 |
| JP | 01-129494 | 5/1989 |
| JP | 03-175695 | 7/1991 |
| JP | 04-062892 | 2/1992 |
| JP | 9027665 | 1/1997 |
| JP | 11346058 | 12/1999 |
| JP | 2003101221 | 4/2003 |

OTHER PUBLICATIONS

Office Action Dated Apr. 13, 2009.

\* cited by examiner

*Primary Examiner*—Rick K Chang
(74) *Attorney, Agent, or Firm*—Yuanmin Cai (57) ABSTRACT

The present invention provides a method of manufacturing a printed circuit board. The method includes the steps of preparing an insulating substrate having a front surface and a back surface and a layer of metal foil formed on each of the front surface and the back surface; selectively forming a plating layer for forming a land on at least one of the metal foils; adjusting a thickness of the plating layer; and forming the metal foils into lines.

19 Claims, 5 Drawing Sheets

MANUFACTURING METHOD OF PRINTED CIRCUIT BOARD

BACKGROUND OF INVENTION

The present invention relates to a method of manufacturing a printed circuit board capable of adjustment of the aspect ratio of via holes and to a printed circuit board manufactured by the manufacturing method.

In recent years, the pitch between terminals of semiconductor chips such as BGA (ball grid array) packages has been reduced. There is a need to reduce the pitch between lines/lands provided on printed circuit boards for mounting of semiconductor chips as well as to reduce the diameter of via/through holes.

A land is a round or polygonal element of a circuit pattern provided on an insulating substrate for a printed circuit board. Terminals of a semiconductor chip are connected to lands, and via holes or through holes are formed in lands. Lines are portions of a circuit pattern other than lands.

When lines are formed with a reduced pitch, it is desirable to reduce the thickness of the metal conductor layer. This is because if the thickness of the metal conductor layer is thick when thin lines having a reduced line spacing (hereinafter referred to as fine lines) are formed by etching, etching cannot be suitably performed so as to avoid occurrence of metal residues (including an anchor) and failure to insulate lines from each other.

In a printed circuit board, openings for via holes or through holes are formed in an insulating substrate and plating is performed on the openings to form via holes or through holes. However, when plating is performed on the openings for via holes or through holes, it is performed on the entire insulating substrate. If plating is performed on the metal conductor layer in an area where lines will be formed, the entire metal layer becomes thick and it is difficult to reliably perform etching so that the lines have a predetermined line and a line spacing. This is a disadvantage to forming of fine lines.

On the other hand, as printed circuit boards become finer, the via hole diameter is reduced. In order to reduce the aspect ratio of via holes, it is necessary to reduce the thickness of the insulating layer (or dielectric layer). The aspect ratio is defined as the quotient of division of the depth of a via hole by the diameter of the via hole. If the insulating layer is a prepreg containing glass cloth, the thickness of the insulating layer is limited by the thickness of the glass cloth and cannot be reduced. In a case where via holes are filled with a plating, it is advantageous to reduce the diameter of the via holes from the viewpoint of the manufacturing time and the plating filling effect. If the diameter of the via holes is reduced, the aspect ratio of the via holes becomes higher and the plating liquid cannot flow smoothly to the bottom of each via hole. As a result, the plating layer at the bottoms of the via holes is made nonuniform in thickness and there is a possibility of occurrence of a crack in the plating layer at the reflow temperature at the time of mounting or in a thermal cycle test and, hence, a possibility of failure to establish interlayer connection.

In order to establish interlayer connection with reliability, it is necessary to increase the plating layer of in the via holes. However, the metal conductor layer in an area where lines are to be formed is also plated simultaneously with plating on the via holes to make the entire metal layer thick, as described above.

This is a disadvantage to forming of fine lines. As described above, it is difficult to reliably perform plating on via holes and to form fine lines.

The thickness of the plating layer formed by plating processing in the process of manufacturing a printed circuit board varies largely. Lines formed on the printed circuit board vary largely in thickness since the plating layer is superposed on metal foil. Also, at the time of etching for forming the lines, failure to completely performing etching may occur due to variation in thickness of the plating layer and there is a possibility of short circuit between the lines in some place.

In some cases, fine lines are formed in such a manner that metal foil on the insulating substrate is separated and plating is then performed to form the lines. However, there is a possibility of the bond strength of the plating layer to the insulating substrate becoming lower than that of the metal foil, i.e., failure to obtain the desired metal bond strength. There is a risk of the plating layer being separated from the insulating substrate when the completed printed circuit board is subject to various tests including a thermal shock test. If the plating layer is separated, the printed circuit board cannot be used as the product. In a case where plating processing is performed directly on an insulating member, there is a possibility of a catalyst such as palladium used in plating processing remaining as a residue to cause insulation degradation. If the catalyst remains as a residue between conductors, there is a risk of occurrence of failure phenomenon such as short circuit between pads when gold plating processing is performed and insulation degradation caused by an electrocorrosion test.

Japanese Patent Laid-Open Publication No. 50-41056 and Japanese Patent Laid-Open Publication No. 01-129494 disclose methods of manufacturing a printed circuit board by performing plating two times on through holes. It is possible to prevent occurrence of a crack in the plating layer by performing plating two times on through holes. Interlayer connections via the through holes can be established with reliability. However, plating is effected on metal foil as well as on through holes. Therefore, it is difficult to form fine lines even if interlayer connection can be established with reliability.

Japanese Patent Laid-Open Publication No. 03-175695 discloses a method of manufacturing a printed circuit board by performing plating on through holes after forming a circuit pattern. Plating is performed two times to ensure interlayer connection between the through holes. However, formed lines are also plated, so that it is difficult to form fine lines. Further, according to a drawing in Publication No. 03-175695, a plating layer is also formed on a side wall of the circuit pattern. Lines are made thicker by the thickness corresponding to the plating layer. The difficulty in forming fine lines is further increased thereby.

Japanese Patent Laid-Open Publication No. 04-62892 discloses a method of plating on through holes. This patent publication relates to a challenge to improve the reliability of connection via a through hole. The challenge is accomplished as described below. A circuit pattern is formed on an insulating substrate, and a mask is provided on the circuit pattern. An opening is formed in the insulating substrate by an operation from above the mask, and the mask on the periphery of the opening is also removed. Plating is performed on an inner opening surface to complete a through hole. According to FIG. 1 of Publication No. 04-62892, a portion on the periphery of the through hole is stepped. That is, the land at the through hole is stepped. The reliability of connection via the through hole in a thermal cycle test can be improved by stepping the land at the through hole. Publication No. 04-62892, however, includes no description of formation of fine lines and adjustment of the aspect ratio to a low value and differs from the present invention in terms of object.

SUMMARY OF INVENTION

Therefore, it is an object of the present invention to provide a printed circuit board manufacturing method and a printed circuit board capable of adjusting the aspect ratio of via holes and forming fine lines.

A method of manufacturing a printed circuit board according to the present invention includes a step of preparing an insulating substrate having a front surface and a back surface, and a layer of metal foil formed on each of the front surface and the back surface, a step of selectively forming a plating layer for forming a land on the metal foil, a step of adjusting the thickness of the plating layer, and a step of forming the metal foil into a line. The plating layer is formed to a thickness larger than the desired thickness. The thickness of the plating layer is thereafter reduced to the desired thickness. Variation in the thickness of the plating layer can be eliminated.

Another method of manufacturing a printed circuit board according to the present invention includes a step of preparing an insulating substrate having a front surface and a back surface, and a layer of metal foil formed on each of the front surface and the back surface, a step of forming an opening in the metal foil and the insulating substrate, a step of forming a resist pattern on the metal foil, a step of forming a plating layer on an inner surface the opening and the exposed metal foil, a step of adjusting the thickness of the plating layer on the metal foil, and a step of forming the metal foil into a line.

A printed circuit board according to the present invention includes, in its outline, an insulating substrate having a front surface and a back surface, lines of metal foil selectively formed on the front surface and the back surface, lands selectively formed on the front surface and the back surface, each land being formed of a stack of the metal foil and a plating layer, a dielectric layer formed on an exposed portion and the lines on each of the front surface and the back surface of the insulating substrate, and a via hole formed on the lands. The lines are formed only on the metal foil to enable the lines to be made finer. A dielectric may be provided on the insulating substrate and the lines and via holes may be formed on the lands, thereby enabling a plurality of layers to form as the layer in which the lines and lands are formed. Since the lands are increased in thickness by plating, the depth of the via holes on the lands is reduced, thus making it possible to reduce the aspect ratio.

DESCRIPTION OF REFERENCE NUMERALS

10, 10a . . . Printed circuit board
12 . . . Insulating substrate
14, 14b, 14c . . . . Metal foil
14a . . . Line
16 . . . Plating layer
18 . . . Through hole
18a . . . Opening
20, 21 . . . Insulating member (dielectric)
22a, 22b, 22c . . . Land
24,26b . . . Resist pattern
26a . . . Resist layer
27 . . . Exposed portion
28 . . . Via hole

DETAILED DESCRIPTION

A printed circuit board manufacturing method and a printed circuit board manufactured by the manufacturing method will be described with reference to the drawings.

Figure 1:
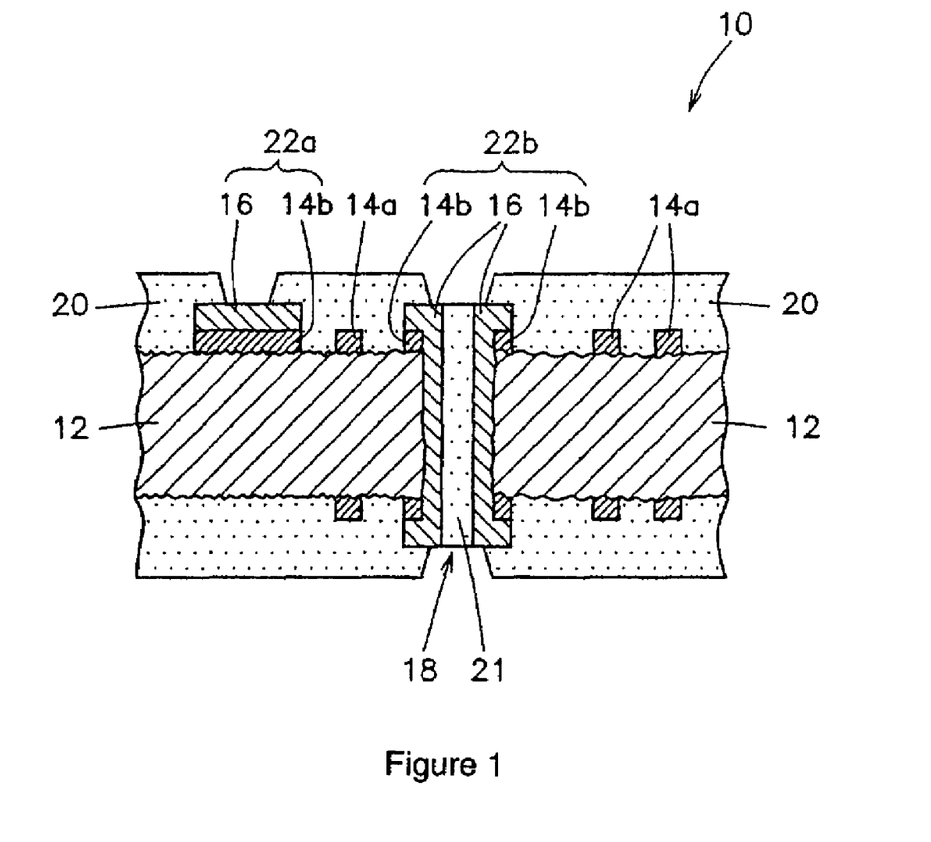
FIG. 1 is a cross-sectional end view a printed circuit board manufactured by a manufacturing method of the present invention.

In a printed circuit board 10 shown in FIG. 1, lands 22a and 22b and lines 14a selectively formed on the front and back surfaces of an insulating substrate 12 differ in thickness from each other. The thickness of the lands 22a and 22b is larger than the thickness of the lines 14a. In the specification and the drawings, lands 22a represent via hole lands, while lands 22b represent through hole lands.

The lines 14a are formed by processing metal foil 14a on the insulating substrate 12v of the printed circuit board 10. The method of processing metal foil 14a is etching described below, or the like. Metal foil 14 is copper foil or the like. The lands 22a and 22b are formed of a stack of foil 14b and a plating layer 16 on the metal foil 14b. The plating layer 16 is formed by copper plating or the like.

A layer of a dielectric 20 is formed over exposed portions of the insulating substrate 12 and the lines 14a, and via holes are formed on lands 22a and 22b, thereby forming a well-known build-up circuit board. A dielectric 21 is embedded in a through hole 18.

Fine lines can be formed by forming the lines 14a only of the metal foil. Because the thickness of the lands 22a and 22b is increased by the value corresponding to the plating layer 16, the depth of the via holes formed on the lands 22a and 22b can be reduced. Therefore, the aspect ratio of the via holes can be reduced.

Figure 2:
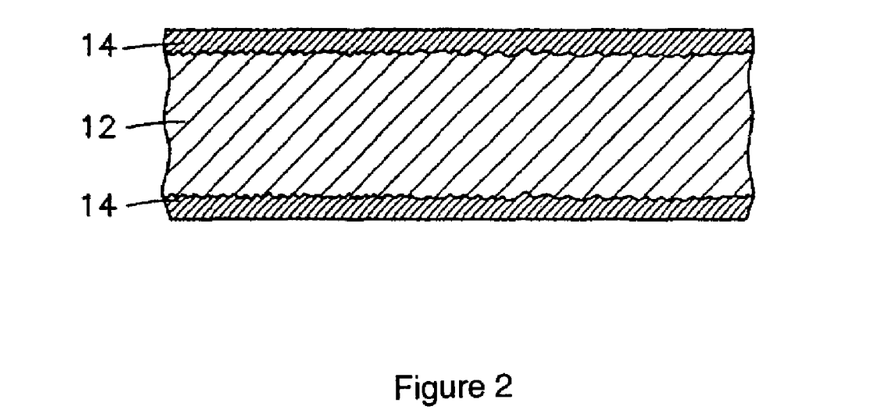
FIG. 2 is a cross-sectional view of an insulating substrate having two surfaces on which layers of metal foil are formed.

The method of manufacturing the printed circuit board 10 shown in FIG. 1 will be described with reference to FIG. 2 and other subsequent figures. An insulating substrate 12 having layers of metal foil 14 formed on the front surface and the back surface as shown in FIG. 2 is prepared. Alternatively, a metal foil may be adhered to an insulating substrate 12. For example, the thickness of the metal foil 14 is 18 μm and the thickness of the insulating substrate 12 is 200 to 400 µm. The metal foil 14 is, for example, copper foil.

Figure 3:
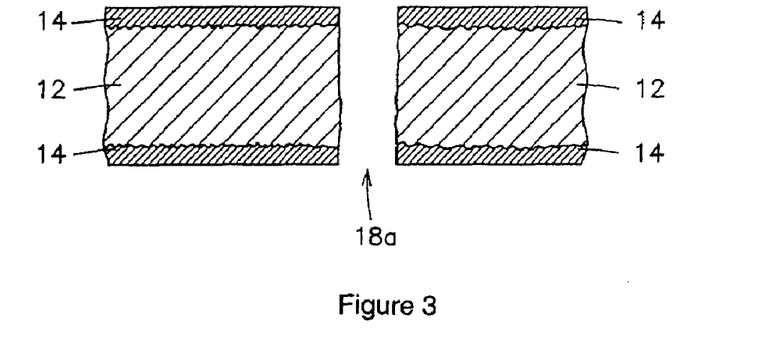
FIG. 3 is a cross-sectional end view a state where an opening is formed in the insulating substrate shown in FIG. 2.

As shown in FIG. 3, an opening 18a is formed by laser or a drill. This opening 18a is an opening for forming in a subsequent step a through hole for electrical connection between the two surfaces of the insulating substrate 12. Cleaning processing is performed on the opening 18a by a chemical solution such as a permanganic acid solution. The diameter of the opening 18a is, for example, 60 µm.

Figure 4:
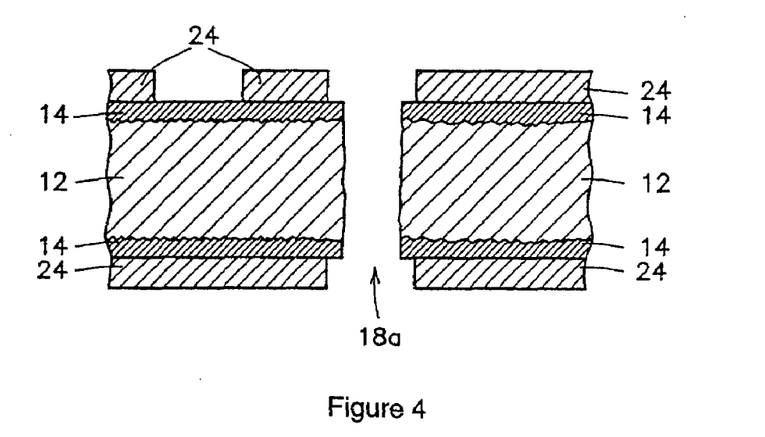
FIG. 4 is a cross-sectional end view of a state where a resist pattern is formed on the surface of the metal foil after the formation of the opening in the insulating substrate.

As shown in FIG. 4, a resist pattern 24 is selectively formed on the metal foil 14. Exposed portions of the metal foil 14 where no resist pattern 24 portion exists are formed as lands in a subsequent step. A resist, e.g., a dry resist is used. For the resist pattern 24, a well-known patterning technique is used. For example, a dry resist is adhered to the metal foil 14, a pattern is exposed, and unnecessary portions are removed by a developer, thereby forming the resist pattern 24. The thickness of the resist pattern 24 is, for example, 25 µm. Before adhesion of the dry resist to the metal foil 14, mechanical polishing or chemical polishing is performed on the metal foil 14, and electroless plating is performed on as base processing for through holes. An electroless plating layer (not shown) is formed on the surface of the metal foil 14 and the inner surface of the opening 18a. The thickness of the metal foil 14 is 17.5 µm.

Figure 5:
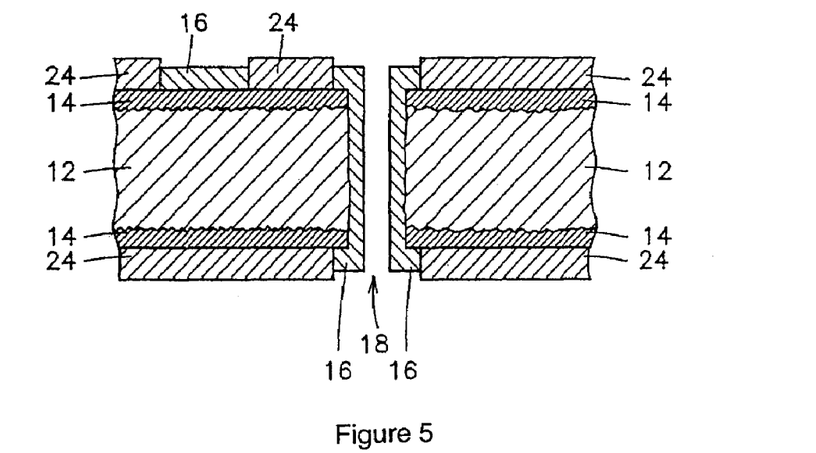
FIG. 5 is a cross-sectional end view of a state where plating is performed after the formation of the resist pattern.

As shown in FIG. 5, the plating layer 16 for forming lands or through holes is formed on exposed portions on which no resist pattern 24 portion exists. The portions on which no resist pattern 24 portion exists are the inner surface of the opening 18a and portions selected in the surface of the metal foil 14 for formation of lands. The plating layer 16 is, for example, a copper plating. No resist pattern 24 portion is formed at least on the periphery of the opening 18a, thereby exposing the metal foil processed by electroless copper plating or electroless plating. The plating layer 16 is selectively formed on the portions for forming lands, while no plating layer 16 is formed on metal foil 14 portions for forming lines. The plating layer 16 is thus formed only on the portions for forming lands to eliminate the need to perform etching for forming lines in a subsequent step after removing the plating layer 16 by a technique such as flash etching. Thus, this method has no considerable influence on the thickness of metal foil 14 and advantageous to forming of fine lines.

The plating layer 16 is formed to a thickness larger than the desired thickness. To adjust the thickness of the plating layer 16 to the desired thickness, the plating layer 16 is reduced from the thickness that it has when it is first formed, as described below. The inner surface of the opening 18a is plated to form the through hole 18.

Figure 6:
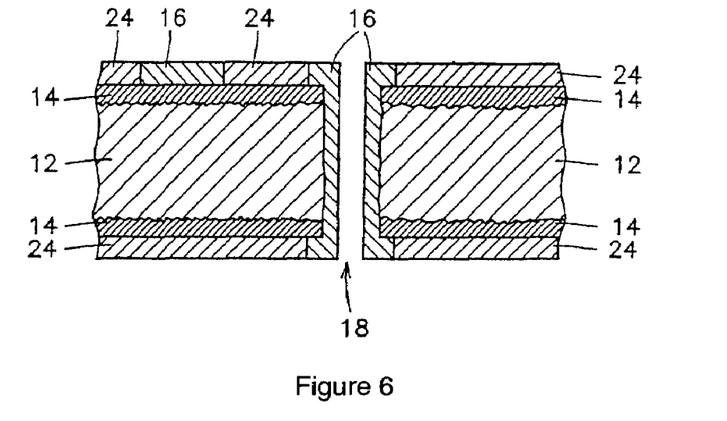
FIG. 6 is a cross-sectional end view of a state where adjustment of the thickness of the plating is performed.

As shown in FIG. 6, adjustment of the thickness of the plating layer 16 is performed. The plating layer 16 and the resist pattern 24 are simultaneously polished to adjust the thickness of the plating layer 16. Polishing is performed with a belt sander or a buff. For example, the thickness of the plating layer 16 is set to 10 µm by polishing. Even if the thickness of the plating layer 16 varies when at the time of forming of the plating layer 16 shown in FIG. 5, the plating layer 16 can be made uniform in thickness by this polishing.

If the thickness of the plating layer 16 after thickness adjustment is equal to or larger than 10 to 15 µm, it is difficult to form the resist pattern for forming the lines 14a described below. This is because the resist layer on the metal foil 14 and the plating layer 16 is stepped, and because if the step is increased, diffused reflection of light occurs at the stepped portion when the resist pattern is formed.

The reason for forming the plating layer 16 to a thickness larger than the desired thickness and thereafter adjusting the thickness of the plating layer 16 by polishing is that these operations are performed for the purpose of adjusting the aspect ratio of the via hole to be formed afterward. By adjusting the thickness of the plating layer 16, the thickness of the lands 22a and 22b is adjusted. The depth of via holes formed on the lands 22a and 22b can be adjusted. By adjusting the depth, via holes having the desired aspect ratio can be formed. Even if the via hole diameter is reduced by making finer the circuit pattern including the lands 22a and 22b and the lines 14a, the aspect ratio of via holes can be reduced.

Figure 7:
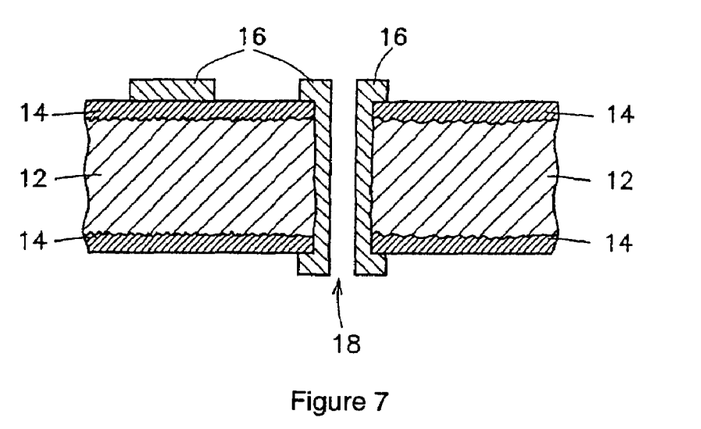
FIG. 7 is a cross-sectional end view of a state where the resist pattern is removed after adjustment of the thickness of the plating.

The process then proceeds to the step of forming lines on the insulating substrate 12 by processing the metal foil 14. As shown in FIG. 7, the resist pattern 24 is removed. The metal foil 14 having the electroless plating layer and the plating layer 16 are polished by soft etching to set the thickness of the metal plate to 17 µm and the thickness of the plating layer 16 to 9.5 µm. This soft etching is also performed in a subsequent step. The thicknesses of the plating layer 16 and the metal foil 14 is set to a value selected by considering the amount by which the plating layer 16 and the metal foil 14 are polished by soft etching.

Figure 8:
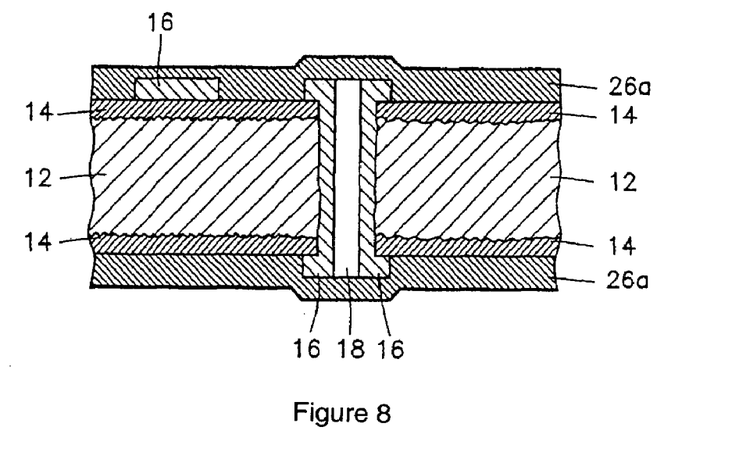
FIG. 8 is a cross-sectional end view of a state where a resist pattern is placed on the metal foil and the plating layer after the removal of the resist pattern.

As shown in FIG. 8, a resist layer 26a is formed on the metal foil 14 and the plating layer 16. As the resist layer 26a, a dry resist or an electrodeposited (ED) resist is used. The resist layer 26a is brought into intimate contact with and bonded to the metal foil 14 and the plating layer 16 so that no air enters the stepped portion.

Figure 9:
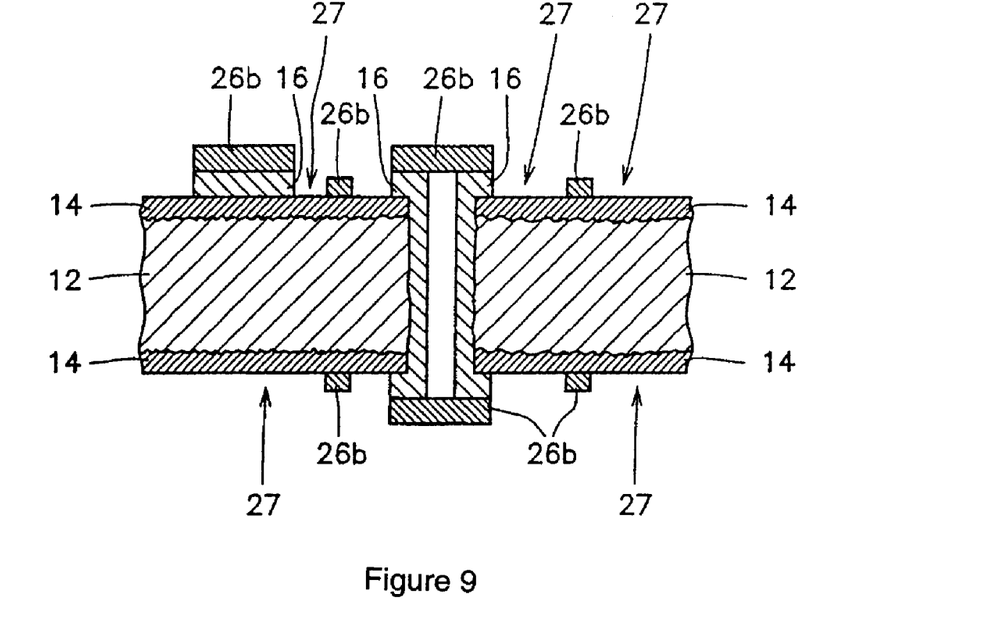
FIG. 9 is a cross-sectional end view of a state where a resist pattern is formed by the resist pattern shown in FIG. 8.

As shown in FIG. 9, a resist pattern 26b is formed. The resist layer 26a on the two layers formed by the metal foil 14 and the plating layer 16 is left as the resist pattern 26b to form lands 22a and 22b shown in FIG. 10. The resist 26a on the metal foil 14 shown in FIG. 8 forms the resist pattern 26b at the positions at which lines and lands are formed in subsequent steps. In other words, exposed portions 27 are selectively formed on the metal foil 14 by the resist layer 26a and the metal foil 14 in the exposed places is etching in a subsequent step.

The exposed metal foil 14 in the places where no resist pattern 26b portions is formed as shown in FIG. 9 is etched. After etching, the resist pattern 26b is removed to form lines 14a and lands 22a and 22b, as sown in FIG. 10.

After the formation of the line 14a and the lands 22a and 22b, a chemical treatment for ensuring the adhesion between the dielectric 20 and the insulating substrate 12 and so on when soft etching is performed and when the dielectric 20 shown in FIG. 1 is superposed. The thickness of the metal foil 14 is set to 16 µm and the thickness of the plating layer is set to 9 µm.

Figure 10:
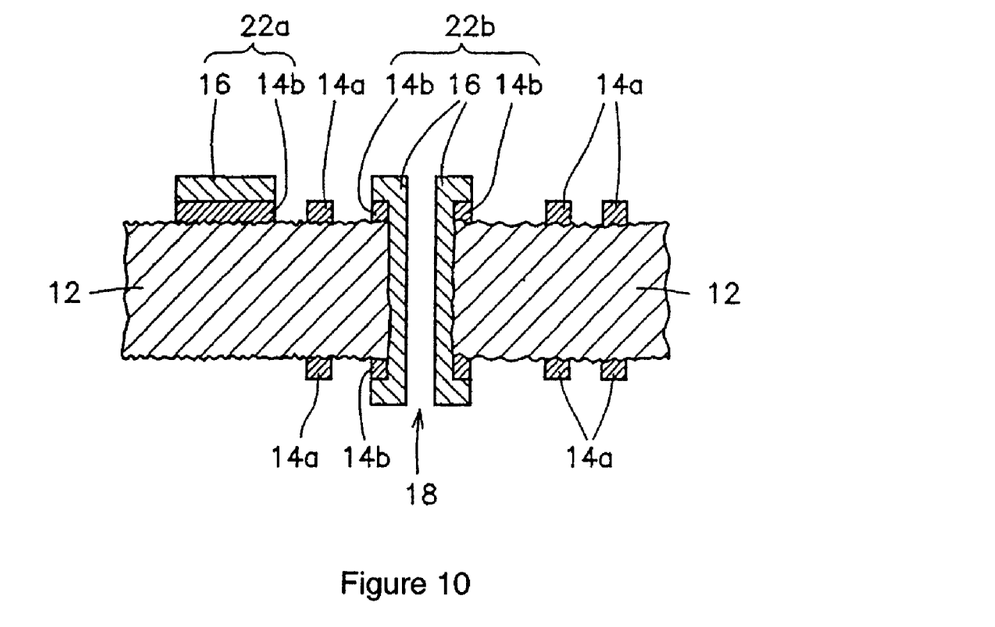
FIG. 10 is a cross-sectional end view of a state where lines and lands are formed by etching.

The lines 14a are formed only by the metal foil 14. The lands 22a and 22b are formed by the metal foil 14b and the plating layer 16 on the metal foil 14b. The lands 22a and 22b and the lines 14a differ in conductor thickness.

Since plating is not performed on the lines 14a, the thickness of the plating layer 16 at the through hole can be increased, thereby ensuring interlayer connection in the insulating substrate 12. Since the lines 14a are formed only by the metal foil 14, they can be formed as fine lines.

Further, as shown in FIG. 1, the dielectric 20 is superposed on the insulating substrate 12, the lands 22a and 22b and the lines 14a. Openings are formed in the dielectric 20 above the lands 22a and 22b, and inner portions of the openings are plated to form via holes. Since the lands 22a and 22b are formed by the metal foil 14b and the plating layer 16, the thickness of thereof is increased relative to that of lines 14a. Therefore, the depth of the formed via holes is reduced to reduce the aspect ratio. Also, when the dielectric 20 is superposed, the dielectric 21 is embedded in the through hole 18.

As shown in FIG. 6, the thickness is adjusted when the lands 22a and 22b are formed. The depth of the via holes can be adjusted by adjusting the thickness of the lands 22a and 22b. Therefore, the aspect ratio of the via holes can be adjusted. Even in a case where the thickness of the dielectric 20 on the insulating substrate 12 is adjusted on the lines or in a case where the thickness cannot be reduced below a predetermined thickness as in the case of a prepreg containing glass cloth, the via holes can be formed with desired aspect ratio.

Since the lines 14a are formed only by the metal foil 14, the thickness of the lines 14a is smaller than that of the lands 22a and 22b. When the lines 14a are made finer, they are not short circuited by a metal residue. Even if variation occurs in the thickness of the plating layer 16, there is no considerable influence on the lines 14a. Since the thickness of the lands 22a and 22b is adjusted during manufacture of the printed circuit board 10 the influence of variation in plating thickness can be reduced. Since the lines 14a are formed without separating the metal foil 14, the bond strength of the lines 14a to the insulating substrate 12 is not reduced.

Figure 11:
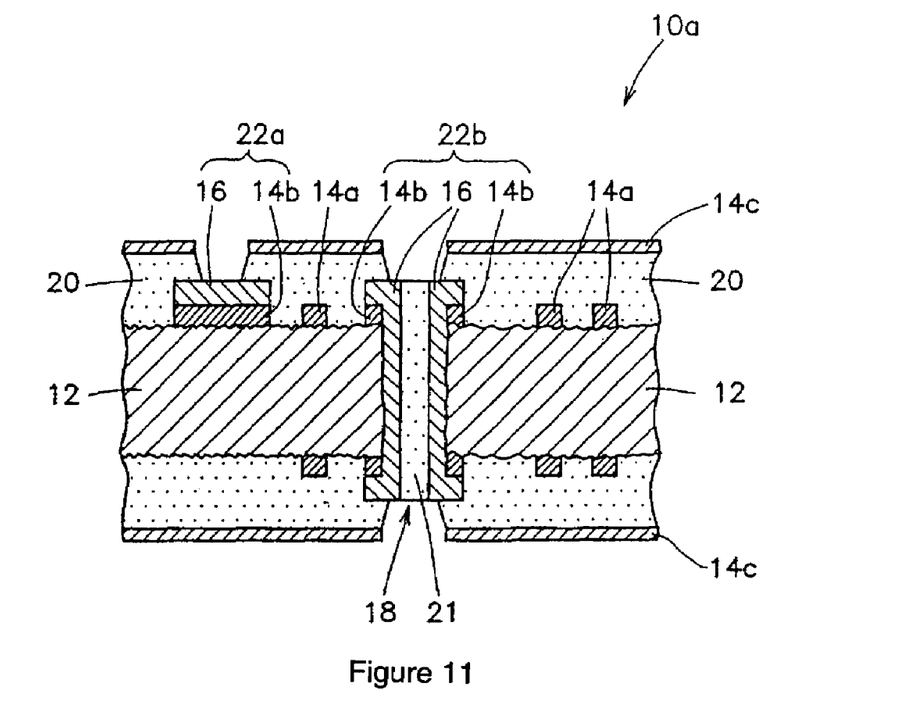
FIG. 11 is a cross-sectional end view of a printed circuit board in a case where a plurality of metal foil layers are provided.
Figure 12:
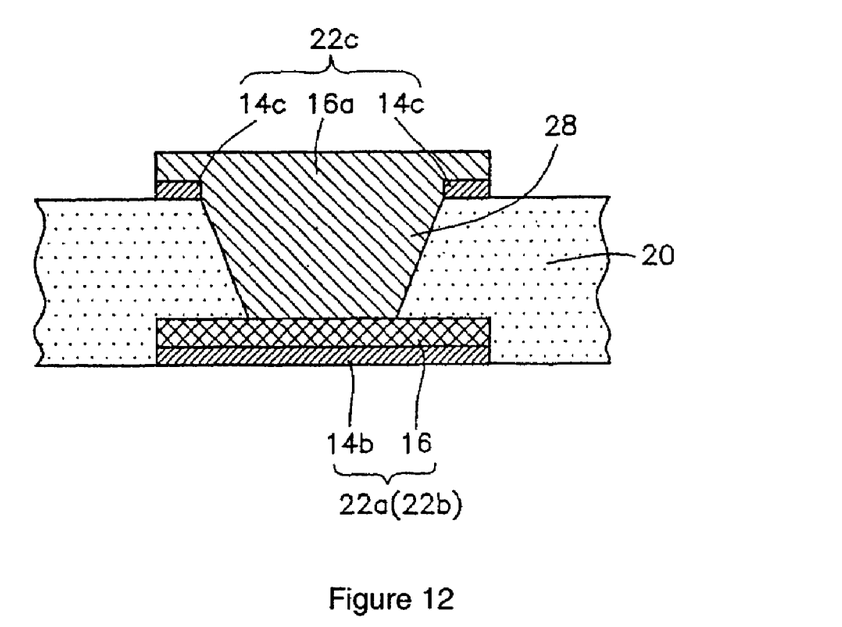
FIG. 12 is a cross-sectional view of a via hole formed on the land shown in FIG. 11.

A plurality of layers may form the lines 14a. After the lands 22a and 22b having a two-layer structure as shown in FIG. 10 have been formed, the insulating member 20 and a metal foil 14c are simultaneously adhered to the layer in which the lines 14a are formed and openings are formed in the insulating member 20 and the metal foil 14c on the lands 22a and 22b, as shown in FIG. 11. After the formation of the openings, a resist pattern in which the portions for forming the lands are exposed is provided on the metal foil 14c, followed by plating. The openings are plated to form via holes 28 shown in FIG. 12. Lands 22c on the via holes 28 also have two-layer structure formed of the metal foil 14c and the plating layer 16a. The aspect ratio of the via holes 28 further formed above can be adjusted by adjusting the thickness of the plating layer 16a in the land 22c as in the case shown in FIG. 6. Line formation after the formation of the lands 22c is the same as that in the manufacturing method shown in FIGS. 8 to 10, and lines are formed only of metal foil 14c. Since the printed circuit board 10a have the lines formed only of metal foil 14c, the lines can be finely formed.

While the numeric values of the thicknesses of the members are shown in the above, the thicknesses are not limited to the values shown above. There is a possibility of occurrence of an error of about 5 μm or less in actual manufacture.

A well-known build-up layer may be formed on the insulating substrate 12 and the lines 14a after the step shown in FIG. 10. In the well-known build-up layer formed of a dielectric layer and a layer above the dielectric layer, lines and lands are formed by plating. Via holes are also formed through the dielectric layer.

While a layer of metal foil 14 is formed on each of the front and back surfaces of the insulating substrate 12 as shown in FIG. 2, a layer of metal foil 14 may be formed on only one surface of the insulating substrate 12. Lands 22a and 22b shown in FIG. 1, or the like are formed on only one surface.

While the present invention has been described with respect to an embodiment thereof, it is not limited to the above-described embodiment. Various improvements, modifications and changes may be made in the described embodiment on the basis of the knowledge of those skilled in the art without departing from the gist of the present invention.

According to the present invention, the aspect ratio of via holes can be adjusted by adjusting the thickness of lands.

Even in a case where the thickness of the dielectric on the insulating substrate is adjusted on lines or in a case where the thickness cannot be reduced below a predetermined thickness as in the case of a prepreg containing glass cloth, via holes with desired aspect ratio can be formed.

The thickness of lands is increased. Therefore the aspect ratio can be reduced even in a case where the opening diameter of the via holes is smaller, thus enabling plating in the via holes to be reliably performed.

Lines are formed only of metal foil while plating on inner surfaces of through holes is performed with reliability.

Since the lines are not plated, the thickness of the lines can be reduced and the lines can be made finer. Since plating is not performed by separating the metal foil, the bond strength of the lines to the insulating substrate is not reduced. Since the surface of the insulating substrate is the metal foil, it is possible to avoid occurrence of a residue of a catalyst such as palladium used in plating processing. This is an advantage in terms of prevention of insulation degradation.

The invention claimed is:

1. A method of manufacturing a printed circuit board comprising:
   preparing an insulating substrate having a front surface and a back surface, and a layer of metal foil formed on at least one of said front surface and said back surface, said metal foil having an up surface;
   selectively forming a plating layer on at least one area of said up surface of said metal foil;
   adjusting a thickness of said plating layer;
   forming a resist pattern on areas of said up surface of said metal foil not covered by said plating layer after said plating layer being selectively formed; and
   forming said areas of said up surface of said metal foil not covered by said plating layer into one or more conductive lines, said one or more conductive lines being defined by said resist pattern and covering a portion of said up surface.

2. The manufacturing method according to claim 1, wherein adjusting said thickness of said plating layer includes polishing a surface of said plating layer.

3. The manufacturing method according to claim 2, wherein forming said areas of said up surface of said metal foil not covered by said plating layer into one or more conductive lines exposes a portion of said insulating substrate, further comprising:
   forming a dielectric layer directly on said exposed portion of said insulating substrate, on said plating layer, and on said one or more conductive lines;
   forming an opening in said dielectric layer above said plating layer; and
   performing plating on said opening.

4. The manufacturing method according to claim 1, further comprising:
   forming a dielectric layer on said insulating substrate, said plating layer and said one or more conductive lines;
   forming an opening in said dielectric layer above said plating layer, said opening exposing at least a portion of said plating layer; and
   performing plating on said opening.

5. A method of manufacturing a printed circuit board comprising the steps of:
   preparing an insulating substrate having a front surface and a back surface, and a layer of metal foil formed on at least one of said front surface and said back surface;
   forming an opening in said metal foil and said insulating substrate;
   forming a first resist pattern on said metal foil;
   forming a plating layer on an inner surface of said opening and areas of an up surface of said metal foil not covered by said first resist pattern;

adjusting a thickness of said plating layer on said metal foil; and forming areas of said up surface of said metal foil not covered by said plating layer into one or more lines, said one or more lines being separated from said areas of said up surface covered by said plating layer and including a portion of said up surface.

6. The manufacturing method according to claim 5, wherein said step of forming said areas of said metal foil into lines comprising the steps of:

removing said first resist pattern;

forming a second resist pattern on said areas of said metal foil;

selectively forming an exposed portion of said areas of said metal foil using said second resist pattern;

etching said metal foil at said exposed portion; and removing said second resist pattern.

7. The manufacturing method according to claim 6, further comprising the steps of:

forming a dielectric layer on said insulating substrate and on said plating layer and said lines on said metal foil;

forming an opening in said dielectric layer; and performing plating on said opening.

8. The manufacturing method according to claim 7, wherein said adjusting step includes a step of polishing a surface of said plating layer.

9. The manufacturing method according to claim 8, wherein said step of polishing includes polishing using a belt sander or a buff.

10. The manufacturing method according to claim 6, wherein said adjusting step includes a step of polishing a surface of said plating layer.

11. The manufacturing method according to claim 10, wherein said step of polishing includes polishing using a belt sander or a buff.

12. The manufacturing method according to claim 5, wherein said adjusting step includes a step of polishing a surface of said plating layer.

13. The manufacturing method according to claim 12, wherein said step of polishing includes polishing using a belt sander or a buff.

14. A method of manufacturing a printed circuit board, the method comprising:

providing an insulating substrate having at least an up surface, said up surface being covered by a layer of metal foil;

forming a first resist layer of a first resist pattern on said metal foil;

forming a plating layer on areas of said metal foil not covered by said first resist pattern;

removing said first resist pattern, thereby exposing said metal foil underneath said first resist pattern, and forming a second resist layer on top of said plating layer and said exposed metal foil, said second resist layer having a second resist pattern on areas of said exposed metal foil previously covered by said first resist pattern; and forming areas of said exposed metal foil previously covered by said first resist pattern into one or more conductive lines, said one or more conductive lines being separated from areas of said metal foil covered by said plating layer.

15. The method according to claim 14, wherein forming areas of said exposed metal foil into said one or more conductive lines comprises:

selectively exposing one or more portions of said areas of said exposed metal foil by applying said second resist pattern thereupon;

etching said one or more portions of said areas of said exposed metal foil, thereby exposing said insulating substrate underneath thereof; and removing said second resist pattern of said second resist layer.

16. The method according to claim 15, further comprising:

forming a dielectric layer covering said exposed insulating substrate, said plating layer, and said one or more conductive lines of said metal foil;

forming an opening in said dielectric layer directly above and partially exposing said plating layer, said plating layer being at a level above said one or more conductive liners of said metal foil; and performing plating on said plating layer exposed by said opening.

17. The method according to claim 16, further comprising performing a chemical treatment of said exposed insulating substrate before forming said dielectric layer.

18. The method according to claim 14, further comprising adjusting a thickness of said plating layer before removing said first resist pattern.

19. The method according to claim 18, wherein adjusting said thickness of said plating layer comprises polishing surfaces of said plating layer and said first resist pattern concurrently.

* * * * *